(12) United States Patent
Song et al.

(10) Patent No.: US 9,543,142 B2
(45) Date of Patent: Jan. 10, 2017

(54) SEMICONDUCTOR NANOCRYSTALS AND METHODS

(71) Applicant: QD VISION, INC., Lexington, MA (US)

(72) Inventors: Inja Song, Watertown, MA (US); Craig Breen, Somerville, MA (US)

(73) Assignee: QD VISION, INC., Lexington, MA (US)

( * ) Notice: Subject to any disclaimer, the term of this patent is extended or adjusted under 35 U.S.C. 154(b) by 45 days.

(21) Appl. No.: 14/182,076

(22) Filed: Feb. 17, 2014

(65) Prior Publication Data

US 2014/0227862 A1      Aug. 14, 2014

Related U.S. Application Data

(63) Continuation of application No. PCT/US2012/043188, filed on Jun. 19, 2012.
(Continued)

(51) Int. Cl.
*H01L 21/02* (2006.01)
*B82Y 30/00* (2011.01)
*B01J 13/22* (2006.01)

(52) U.S. Cl.
CPC .......... *H01L 21/02518* (2013.01); *B01J 13/22* (2013.01); *B82Y 30/00* (2013.01)

(58) Field of Classification Search
None
See application file for complete search history.

(56) References Cited

U.S. PATENT DOCUMENTS 4,525,214 A    6/1985   Panken
5,677,545 A   10/1997   Shi et al.
(Continued)

FOREIGN PATENT DOCUMENTS

AU     5451496     12/1996
EP     0109628 A1    5/1984
(Continued)

OTHER PUBLICATIONS

Schwerzel et al, J. Phys. Chem. A, 102, pp. 5622-5626, 1998.*
(Continued)

*Primary Examiner* — Erma Cameron

(57) ABSTRACT

In one embodiment, a method for forming a coating comprising a semiconductor material on at least a portion of a population of semiconductor nanocrystals comprises providing a first mixture including semiconductor nanocrystals and an aromatic solvent, introducing one or more cation precursors and one or more anion precursors into the first mixture to form a reaction mixture for forming the semiconductor material, reacting the precursors in the reaction mixture, without the addition of an acid compound, under conditions sufficient to grow a coating comprising the semiconductor material on at least a portion of an outer surface of at least a portion of the semiconductor nanocrystals, and wherein an amide compound is formed in situ in the reaction mixture prior to isolating the coated semiconductor nanocrystals. In another embodiment, method for forming a coating comprising a semiconductor material on at least a portion of a population of semiconductor nanocrystals comprises providing a first mixture including semiconductor nanocrystals and a solvent, introducing an amide compound, one or more cation precursors and one or more anion precursors into the first mixture to form a reaction mixture for forming the semiconductor material, and reacting the precursors in the reaction mixture in the presence of the
(Continued)

amide compound, under conditions sufficient to grow a coating comprising the semiconductor material on at least a portion of an outer surface of at least a portion of the semiconductor nanocrystals. Semiconductor nanocrystals including coatings grown in accordance with the above methods are also disclosed.

6 Claims, 1 Drawing Sheet

Related U.S. Application Data

(60) Provisional application No. 61/525,610, filed on Aug. 19, 2011.

(56) References Cited

U.S. PATENT DOCUMENTS

| | | | |
|---|---|---|---|
| 5,831,125 A | 11/1998 | Sakurai et al. | |
| 6,106,609 A | 8/2000 | Yang et al. | |
| 6,319,426 B1 | 11/2001 | Bawendi et al. | |
| 6,322,901 B1 | 11/2001 | Bawendi et al. | |
| 6,472,389 B1 | 10/2002 | Ohtani et al. | |
| 6,869,545 B2 | 3/2005 | Peng et al. | |
| 6,872,249 B2 | 3/2005 | Peng et al. | |
| 6,949,206 B2 | 9/2005 | Whiteford et al. | |
| 7,068,898 B2 | 6/2006 | Buretea et al. | |
| 7,147,712 B2 | 12/2006 | Zehnder et al. | |
| 7,160,613 B2 | 1/2007 | Bawendi et al. | |
| 7,253,452 B2 | 8/2007 | Steckel et al. | |
| 7,374,807 B2 | 5/2008 | Parce et al. | |
| 7,393,400 B2 | 7/2008 | Kitawaki et al. | |
| 7,482,059 B2 | 1/2009 | Peng et al. | |
| 7,767,260 B2 | 8/2010 | Peng et al. | |
| 7,952,105 B2 | 5/2011 | Cok | |
| 7,964,278 B2 | 6/2011 | Banin et al. | |
| 8,354,785 B2 | 1/2013 | Clough et al. | |
| 8,845,927 B2 | 9/2014 | Breen et al. | |
| 8,849,087 B2 | 9/2014 | Breen et al. | |
| 9,136,428 B2 | 9/2015 | Clough et al. | |
| 9,212,056 B2 | 12/2015 | Breen et al. | |
| 9,297,092 B2 | 3/2016 | Breen et al. | |
| 2002/0020830 A1 | 2/2002 | Bass et al. | |
| 2002/0066401 A1 | 6/2002 | Peng et al. | |
| 2003/0059635 A1 | 3/2003 | Naasani | |
| 2003/0173541 A1 | 9/2003 | Peng et al. | |
| 2003/0209105 A1 | 11/2003 | Bawendi et al. | |
| 2004/0023010 A1 | 2/2004 | Bulovic et al. | |
| 2004/0023261 A1 | 2/2004 | Bruchez et al. | |
| 2004/0048241 A1 | 3/2004 | Freeman et al. | |
| 2004/0122248 A1 | 6/2004 | Shenai-Khatkhate et al. | |
| 2004/0146560 A1 | 7/2004 | Whiteford et al. | |
| 2004/0265571 A1 | 12/2004 | Schwartz et al. | |
| 2005/0058416 A1 | 3/2005 | Hoon Lee et al. | |
| 2005/0112849 A1 | 5/2005 | Stott et al. | |
| 2005/0119105 A1 | 6/2005 | Zimmer et al. | |
| 2005/0120946 A1 | 6/2005 | Hines et al. | |
| 2005/0123765 A1 | 6/2005 | Ong et al. | |
| 2005/0129947 A1 | 6/2005 | Peng et al. | |
| 2005/0209123 A1 | 9/2005 | Laux | |
| 2005/0258418 A1 | 11/2005 | Steckel et al. | |
| 2005/0265922 A1 | 12/2005 | Nie et al. | |
| 2005/0266246 A1 | 12/2005 | Reiss et al. | |
| 2006/0006396 A1 | 1/2006 | Chua et al. | |
| 2006/0083694 A1 | 4/2006 | Kodas et al. | |
| 2006/0088659 A1 | 4/2006 | Bonitatebus, Jr. et al. | |
| 2006/0110279 A1 | 5/2006 | Han et al. | |
| 2006/0110313 A1 | 5/2006 | Cho et al. | |
| 2006/0128845 A1 | 6/2006 | Emrick et al. | |
| 2006/0130741 A1 | 6/2006 | Peng et al. | |
| 2006/0157720 A1 | 7/2006 | Bawendi et al. | |
| 2006/0202167 A1 | 9/2006 | Landry et al. | |
| 2006/0216508 A1 | 9/2006 | Denisyuk et al. | |
| 2006/0216510 A1 | 9/2006 | Denisyuk et al. | |
| 2006/0216759 A1 | 9/2006 | Naasani | |
| 2007/0049765 A1 | 3/2007 | Lucey et al. | |
| 2007/0072979 A1 | 3/2007 | Moad et al. | |
| 2007/0103068 A1 | 5/2007 | Bawendi et al. | |
| 2007/0128439 A1 | 6/2007 | Kim et al. | |
| 2007/0221121 A1 | 9/2007 | Zehnder et al. | |
| 2007/0221947 A1 | 9/2007 | Locascio et al. | |
| 2007/0269904 A1 | 11/2007 | Uyeda et al. | |
| 2007/0289491 A1 | 12/2007 | Peng et al. | |
| 2008/0001167 A1 | 1/2008 | Coe-Sullivan et al. | |
| 2008/0089836 A1 | 4/2008 | Hainteld | |
| 2008/0099728 A1 | 5/2008 | Jin et al. | |
| 2008/0118755 A1 | 5/2008 | Whiteford et al. | |
| 2008/0160306 A1 | 7/2008 | Mushtaq | |
| 2008/0202383 A1 | 8/2008 | Shi | |
| 2008/0220593 A1 | 9/2008 | Pickett et al. | |
| 2008/0247932 A1 | 10/2008 | Li et al. | |
| 2008/0258159 A1 | 10/2008 | Jun et al. | |
| 2009/0073349 A1 | 3/2009 | Park et al. | |
| 2009/0152567 A1 | 6/2009 | Comerford et al. | |
| 2009/0162011 A1 | 6/2009 | Coe-Sullivan et al. | |
| 2009/0181478 A1 | 7/2009 | Cox et al. | |
| 2009/0215208 A1 | 8/2009 | Coe-Sullivan et al. | |
| 2009/0215209 A1 | 8/2009 | Anc et al. | |
| 2009/0251759 A1 | 10/2009 | Domash et al. | |
| 2009/0278141 A1 | 11/2009 | Coe-Sullivan et al. | |
| 2009/0283743 A1 | 11/2009 | Coe-Sullivan et al. | |
| 2009/0283778 A1 | 11/2009 | Coe-Sullivan et al. | |
| 2010/0001256 A1 | 1/2010 | Coe-Sullivan et al. | |
| 2010/0009338 A1 | 1/2010 | Zhang et al. | |
| 2010/0044635 A1 | 2/2010 | Breen et al. | |
| 2010/0044636 A1 | 2/2010 | Ramprasad et al. | |
| 2010/0051870 A1 | 3/2010 | Ramprasad | |
| 2010/0051901 A1 | 3/2010 | Kazlas et al. | |
| 2010/0052512 A1 | 3/2010 | Clough et al. | |
| 2010/0068468 A1 | 3/2010 | Coe-Sullivan et al. | |
| 2010/0090164 A1 | 4/2010 | Peng et al. | |
| 2010/0132770 A1 | 6/2010 | Beatty et al. | |
| 2010/0159248 A1 | 6/2010 | Jang et al. | |
| 2010/0265307 A1 | 10/2010 | Linton et al. | |
| 2010/0283014 A1 | 11/2010 | Breen et al. | |
| 2010/0314646 A1 | 12/2010 | Breen et al. | |
| 2011/0223110 A1 | 9/2011 | Bartel et al. | |
| 2011/0233483 A1 | 9/2011 | Breen et al. | |
| 2011/0236315 A1 | 9/2011 | Han et al. | |
| 2011/0245533 A1 | 10/2011 | Breen et al. | |
| 2013/0069018 A1 | 3/2013 | Zhu et al. | |
| 2013/0092886 A1 | 4/2013 | Kahen et al. | |
| 2013/0273247 A1 | 10/2013 | Kamplain et al. | |
| 2014/0140918 A1 | 5/2014 | Breen et al. | |
| 2014/0322901 A1 | 10/2014 | Huang et al. | |
| 2015/0086169 A1 | 3/2015 | Breen et al. | |
| 2015/0166341 A1 | 6/2015 | Hamilton et al. | |

FOREIGN PATENT DOCUMENTS

| | | |
|---|---|---|
| EP | 0745646 | 12/1996 |
| JP | 2002053319 A | 2/2002 |
| JP | 2002079076 A | 3/2002 |
| WO | WO2005022120 A2 | 3/2005 |
| WO | WO2009035657 A1 | 3/2009 |
| WO | WO2009097319 | 8/2009 |
| WO | WO2009145813 A1 | 12/2009 |
| WO | WO2010014198 A1 | 2/2010 |
| WO | WO 2010/048581 * | 4/2010 |
| WO | WO2011100023 A1 | 8/2011 |
| WO | WO2012099653 A2 | 7/2012 |
| WO | WO2013028253 A1 | 2/2013 |
| WO | WO2013173409 A1 | 11/2013 |

OTHER PUBLICATIONS

Dou et al, Journal of Luminescence, 108, pp. 355-358, 2004.*
Aharoni, et al., "Synthesis of InAs/CdSe/ZnSe Core/Shell1/Shell2 Structures with Bright and Stable Near-Infrared Fluorescence", *J. Am. Chem. Soc.* (2006), vol. 128, pp. 257-264.

(56) References Cited

OTHER PUBLICATIONS

Dabbousi, et al., "(CdSe) ZnS Core-Shell Quantum Dots: Synthesis and Characterization of a Size Series of Highly Luminescent Nanocrystallites", J. Phys. Chem. 101, 9463, 1997.
Doussineau, et al., "Synthesis of phosphonic acids with the semicarbazide group for the functionalization of metal oxide mid zeolite nanoparticles", *Synlett* (2004) No. 10, pp. 1735-1738.
Diamente, et al., "Bioconjugation of Ln3+-Doped LaF3 Nanoparticles to Avidin", *Langmuir*, (2006), 22, 1782-1788.
Guzelian, et al., "Colloidal chemical synthesis and characterization of InAs nanocrystal quantum dots" *Appl. Phys. Lett.* (1996) vol. 69, No. 10, pp. 1432-1434.
Hines, et al., "Synthesis and Characterization of Strongly Luminescing ZnS-Capped CdSe Nanocrystals", J. Phys. Chem., 1996, 100, 468-471.
Leatherdale, et al., "On the Absorption Cross Section of CdSe Nanocrystal Quantum Dots", J. Phys. Chem. B, 2002, 106 (31), pp. 7619-7622.
Murray, C., et al., "Synthesis and Characterization of Nearly Monodisperse CdE (E=S, Se, Te) Semiconductor Nanocrystallites" (Nov. 1993), *J. Am. Chem. Soc.*, 115, pp. 8706-8715.
Murray, C., et al., Thesis of "Synthesis and Characterization of II-VI Quantum Dots and Their Assembly into 3-D Quantum Dot Superlattices", Massachusetts Institute of Technology, Sep. 1995.
PCT Search Report and Written Opinion mailed Jan. 31, 2013 for PCT/US2012/043188, which is the parent of this case.
Xu, S., et al., "Rapid Synthesis of High-Quality InP Nanocrystals", *J. Am. Chem. Soc.* (Jan. 7, 2006), vol. 128, No. 4, pp. 1054-1055.
Xu, S., et al., "Rapid synthesis of highly luminescent InP and InP/ZnS nanocrystals", J. Mater. Chem., 2008, 18, 2653-2656 (2008).

\* cited by examiner

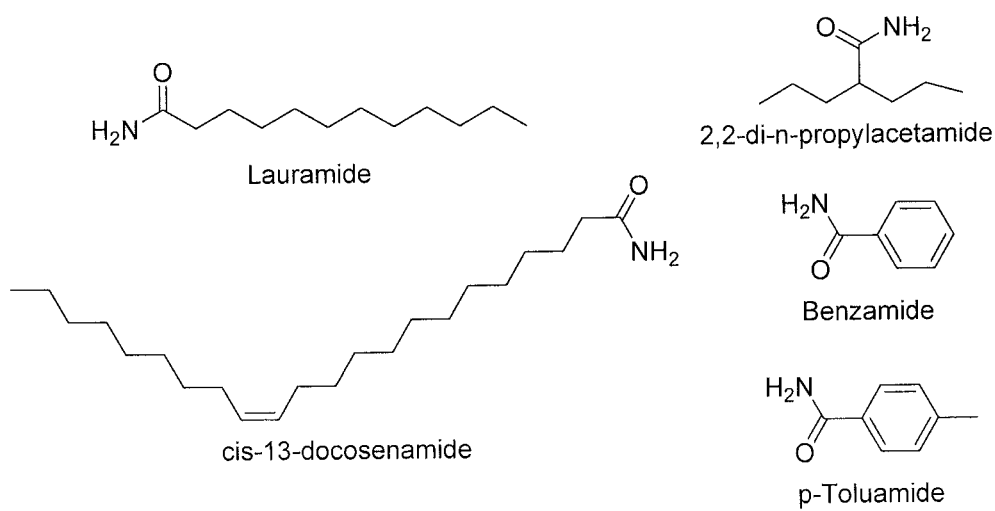

SEMICONDUCTOR NANOCRYSTALS AND METHODS

This application is a continuation of International Application No. PCT/US2012/043188, filed 19 Jun. 2012, which was published in the English language as International Publication No. WO 2013/028253 on 28 Feb. 2013, which International Application claims priority to U.S. Provisional Patent Application No. 61/525,610 filed 19 Aug. 2011. Each of the foregoing is hereby incorporated herein by reference in its entirety.

FEDERALLY SPONSORED RESEARCH OR DEVELOPMENT

This invention was made with Government support under Advanced Technology Program Award No. 70NANB7H7056 awarded by NIST. The United States has certain rights in the invention.

TECHNICAL FIELD OF THE INVENTION

The present invention relates to the technical field of nanotechnology, and more particularly to, semiconductor nanocrystals and related methods.

SUMMARY OF THE INVENTION

In accordance with one aspect of the present invention there is provided a method for forming a coating comprising a semiconductor material on at least a portion of a population of semiconductor nanocrystals, the method comprising: providing a first mixture including semiconductor nanocrystals and an aromatic solvent, introducing one or more cation precursors and one or more anion precursors into the first mixture to form a reaction mixture for forming the semiconductor material, reacting the precursors in the reaction mixture, without the addition of an acid compound, under conditions sufficient to grow a coating comprising the semiconductor material on at least a portion of an outer surface of at least a portion of the semiconductor nanocrystals, and wherein an amide compound is formed in situ in the reaction mixture prior to isolating the coated semiconductor nanocrystals.

In certain embodiments, the aromatic solvent has a boiling point greater than or equal to about 300° C.

In certain embodiments, the aromatic solvent has a melting point less than about 100° C.

In certain embodiments, the aromatic solvent has a melting point in a range from about 50 to about 100° C.

Examples of aromatic solvents include, but are not limited to, dodecanophenone, ortho-terphenyl, 3-phenylbicylcohexyl, and p-tolyl sulfoxide.

In certain preferred embodiments, the amide compound is generated in situ from reaction of an amine compound and an ester.

In certain of such embodiments, an amine compound comprises a primary amine. In certain of such embodiments, an amine compound comprises a secondary amine. In certain of such embodiments, an amine compound comprises a mixture including a primary amines and a secondary amine. In certain embodiments, an amine compound can include an organic group that includes one or more substituents. In certain embodiments, an amine compound can include an organic group that includes one more heteroatoms. Other amines may also be determined by the skilled artisan to be useful or desirable.

In certain embodiments, an ester can include, for example, but not limited to, fatty acid esters and alkyl fatty acid esters. Examples include, but are not limited to, methyl laurate, ethyl laurate, isopropyl laurate, methyl myristate, ethyl myristate, isopropyl myristate, methyl palmitate, ethyl palmitate, isopropyl palmitate, methyl oleate, ethyl oleate, isopropyl oleate, methyl linoleate, ethyl linoleate, isopropyl linoleate, etc. Other esters may also be determined by the skilled artisan to be useful or desirable.

In accordance with another aspect of the present invention, there is provided a method for forming a coating comprising a semiconductor material on at least a portion of a population of semiconductor nanocrystals, the method comprising: providing a first mixture including semiconductor nanocrystals and a solvent, introducing an amide compound, one or more cation precursors and one or more anion precursors into the first mixture to form a reaction mixture for forming the semiconductor material, and reacting the precursors in the reaction mixture in the presence of the amide compound, under conditions sufficient to grow a coating comprising the semiconductor material on at least a portion of an outer surface of at least a portion of the semiconductor nanocrystals.

Preferably the coating is grown in the presence of an amide compound without the addition of an acid compound.

In accordance with another aspect of the present invention, there is provided a semiconductor nanocrystal including a coating over at least a portion of an outer surface thereof prepared in accordance with a method taught herein.

As used herein, an "amide compound" refers to any organic compound that contains a functional group consisting of a carbonyl group ($R_1$—C═O) linked to a nitrogen atom, the term "amide compound" can refer to a class of compounds and to a functional group within those compounds. An amide compound can be a primary amide (i.e., the nitrogen of the functional group in linked to only one carbon atom), a secondary amide (i.e., the nitrogen of the functional group in linked to two carbon atoms), or a tertiary amide (i.e., the nitrogen of the functional group in linked to three carbon atoms). An atom or group to which the nitrogen of the functional group is linked can be the same as or different from any of the other atoms or groups linked thereto.

As used herein, an "amine compound" refers to any organic compound that contains at least one basic nitrogen atom with a lone electron pair or compound that includes an organic functional group that contains at least one basic nitrogen atom with a lone electron pair.

As used herein, an "acid compound" refers to an inorganic acid or an organic acid.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

Additional information concerning the foregoing, and other information useful with the present inventions is provided below.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

BRIEF DESCRIPTION OF THE DRAWINGS

In the drawings:

FIG. 1 illustrates the chemical structures of examples of primary amide ligands for use in the present invention.

The attached figures are simplified representations presented for purposes of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

In accordance with one aspect of the present invention, there is provided a method for forming a coating comprising a semiconductor material on at least a portion of a population of semiconductor nanocrystals, the method comprising: providing a first mixture including semiconductor nanocrystals and an aromatic solvent, introducing one or more cation precursors and one or more anion precursors into the first mixture to form a reaction mixture for forming the semiconductor material, reacting the precursors in the reaction mixture, without the addition of an acid compound, under conditions sufficient to grow a coating comprising the semiconductor material on at least a portion of an outer surface of at least a portion of the semiconductor nanocrystals, and wherein an amide compound is formed in situ in the reaction mixture prior to isolating the coated semiconductor nanocrystals.

In certain embodiments, the aromatic solvent has a boiling point greater than or equal to about 300° C.

In certain embodiments, the aromatic solvent has a melting point less than about 100° C.

In certain embodiments, the aromatic solvent has a melting point in a range from about 50 to about 100° C.

Examples of aromatic solvents include, but are not limited to, dodecanophenone, ortho-terphenyl, 3-phenylbicylcohexyl, and p-tolyl sulfoxide.

In certain embodiments, the amide compound is generated in situ from an amine compound and an ester under conditions to form an amide compound therefrom.

In certain embodiments, the amide compound is generated before introduction of any of the precursors.

In certain embodiments, the amide compound is generated during growth of the coating.

In certain embodiments, the amide compound is generated after growth of the coating, before isolation of the coated nanocrystals from the growth mixture.

In certain of such embodiments, an amine compound comprises a primary amine. Examples of primary amines include, but are not limited to, those represented by the formula $CH_3(CH_2)_nNH_2$ wherein n=5-19 (e.g., hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine). Other primary amines can be readily ascertained by one of ordinary skill in the art.

In certain of such embodiments, an amine compound comprises a secondary amine. Examples of secondary amines include, but are not limited to, those represented by the formula $(CH_3(CH_2)_n)_2NH$ wherein n=3-11 (e.g., dibutylamine, dipentylamine, dihexylamine, diheptylamine, dioctylamine, dinonylamine, didecylamine, diundecylamine, didodecylamine), etc. Other secondary amines can be readily ascertained by one of ordinary skill in the art.

In certain embodiments, an amine compound comprises a mixture including a primary amines and a secondary amine.

In certain embodiments, an amine compound comprises one or more hydrocarbon groups.

In certain embodiments, an amine compound comprises a hydrocarbon group that can include one or more substituent groups. For example, an amine compound comprises a 3,3-diphenylpropylamine.

In certain embodiments, an amine compound comprises one or more $C_2$-$C_{18}$ hydrocarbon chains.

In certain embodiments, an amine compound comprises one or more hydrocarbon chains that can be branched.

In certain embodiments, an amine compound comprises one or more hydrocarbon chains that can be unbranched.

In certain embodiments, an amine compound comprises one or more hydrocarbon chains that can include at least one heteroatom.

In certain embodiments, an amine compound further includes an ether linkage. For example, an amines compound can comprise 3-(2-ethylhexyloxy)propylamine.

In certain embodiments, an amine compound includes at least one aromatic group.

In certain embodiments, an amine compound includes at least one aliphatic group.

In certain embodiments, the addition of the one or more cation precursors and the one or more anion precursors is a stepwise addition or introduction.

In certain embodiments, one or more cation precursors and one or more anion precursors are introduced at predetermined rates, wherein the rate of addition of the one or more cation precursor and the rate of addition of the one or more anion precursors can be the same as or different from the other.

In certain embodiments, the one or more cation precursors are added separately from the one or more anion precursors.

In certain embodiments, the one or more cation precursors and one or more anion precursors are added concurrently.

In certain embodiments, the coating is grown at a temperature in a range from about 150° C. to about 350° C.

In certain embodiments, the coating is grown at a temperature in a range from about 150° C. to about 300° C.

In certain embodiments, the coating is grown at a temperature in a range from about 200° C. to about 250° C.

In certain embodiments, the coating is grown at a temperature of about 250° C.

By adjusting the temperature of the reaction mixture during growth of a coating and monitoring the absorption and emission spectrum of the nanocrystal during growth of the coating, coated semiconductor nanocrystals having high quantum efficiencies and narrow size distributions can be obtained.

In accordance with another aspect of the present invention, there is provided a method for forming a coating comprising a semiconductor material on at least a portion of a population of semiconductor nanocrystals, the method comprising: providing a first mixture including semiconductor nanocrystals and a solvent, introducing an amide compound, one or more cation precursors and one or more anion precursors into the first mixture to form a reaction mixture for forming the semiconductor material, and reacting the precursors in the reaction mixture in the presence of the amide compound, under conditions sufficient to grow a coating comprising the semiconductor material on at least a portion of an outer surface of at least a portion of the semiconductor nanocrystals.

Preferably the coating is grown in the presence of the amide compound without the addition of an acid compound.

In certain embodiments, the amide compound is introduced before initiating introduction of the one or more cation precursors and one or more anion precursors.

In certain embodiments, the amide compound is introduced after initiating introduction of the one or more cation precursors and one or more anion precursors.

In certain embodiments, an amide compound preferably comprises a primary amide. A general structure of a primary amide is represented by the formula:

$$H_2N-\overset{\overset{O}{\|}}{C}-R_1-R_2-R_3$$

where $R_1$ and $R_2$, which can be the same or different, represent a bond, an alkyl or alkylene group, an aryl or arylene group, a fluorocarbon group, —O—  —NH—  —S—  —$\overset{|}{\underset{R_4}{O}}$—  —$\overset{|}{\underset{R_4}{N}}$—

—S=O  —C=O  —S=O  —C=O  —P=O wherein $R_4$ is an alkyl or alkylene group or an aryl or arylene group; $R_3$ represents hydrogen, an alkyl or alkylene group, an aryl or arylene group, —$OR_6$, —$NHR_6$, —$NR_6R_6$, —$SR_6$, wherein $R_6$ represents hydrogen, an alkyl group, or an aryl group.

In certain embodiments, an amide compound comprises a secondary amide.

In certain embodiments, an amide compound comprises a mixture including a primary amide and a secondary amide.

In certain embodiments, an amide compound comprises one or more hydrocarbon groups.

In certain embodiments, an amide compound comprises a hydrocarbon group that can include one or more substituent groups.

In certain embodiments, an amide compound comprises one or more $C_2$-$C_{18}$ hydrocarbon chains.

In certain embodiments, an amide compound comprises one or more hydrocarbon chains that can be branched.

In certain embodiments, an amide compound comprises one or more hydrocarbon chains that can be unbranched.

In certain embodiments, an amide compound comprises one or more hydrocarbon chains that can include at least one heteroatom.

In certain embodiments, an amide compound further includes an ether linkage.

In certain embodiments, an amide compound includes at least one aromatic group.

In certain embodiments, an amide compound includes at least one aliphatic group.

Examples of amides include, but are not limited to, 2,2-di-n-propylacetamide, lauramide, cis-1,3-docosenamide, benzamide, p-toluamide, etc. Other amides may be determined by the skilled artisan to be useful or desirable.

In certain embodiments, the solvent comprises a mixture of two or more solvents. A solvent is preferably non-aqueous. In certain embodiments, the solvent includes an aromatic solvent. In certain embodiments, the solvent includes an aliphatic solvent. A solvent can be coordinating or non-coordinating.

In certain embodiments, an aromatic solvent can have a boiling point greater than or equal to about 300° C.

In certain embodiments, an aromatic solvent can have a melting point less than about 100° C.

In certain embodiments, an aromatic solvent can have a melting point in a range from about 50 to about 100° C.

Examples of solvents include, but are not limited to, dodecanophenone, ortho-terphenyl, 3-phenylbicylcohexyl, p-tolyl sulfoxide, etc.

Other solvents may be determined by the skilled artisan to be useful or desirable.

In certain preferred embodiments, the coating is grown in the presence of an amide compound and an amine compound.

In certain embodiments, the addition of the one or more cation precursors and the one or more anion precursors is a stepwise addition.

In certain embodiments, the one or more cation precursors and one or more anion precursors are introduced at predetermined rates, wherein the rate of addition of the one or more cation precursor and the rate of addition of the one or more anion precursors can be the same as or different from the other.

In certain embodiments, the one or more cation precursors are added separately from the one or more anion precursors.

In certain embodiments, the one or more cation precursors and one or more anion precursors are added concurrently.

In certain embodiments, the coating is grown at a temperature in a range from about 150° C. to about 350° C.

In certain embodiments, the coating is grown at a temperature in a range from about 150° C. to about 300° C.

In certain embodiments, the coating is grown at a temperature in a range from about 200° C. to about 250° C.

In certain embodiments, the coating is grown at a temperature of about 250° C.

By adjusting the temperature of the reaction mixture during growth of a coating and monitoring the absorption and emission spectrum of the nanocrystal during growth of the coating, coated semiconductor nanocrystals having high quantum efficiencies and narrow size distributions can be obtained.

In accordance with another aspect of the present invention, there is provided a semiconductor nanocrystal including a coating over at least a portion of an outer surface thereof prepared in accordance with a method taught herein.

A coating grown on a semiconductor nanocrystal in accordance with the methods taught herein comprises a semiconductor material. Examples of semiconductor materials include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing.

In certain embodiments, the semiconductor material included in the coating can comprise a composition that is the same as or different from the composition of a semiconductor included in the semiconductor nanocrystal on which it is grown.

A coating can have a thickness less than about one monolayer, about one monolayer, or greater than one monolayer. Preferably, the thickness is less than that at which quantum confinement is not achieved. The thickness can be selected to achieve desired predetermined characteristics of the semiconductor nanocrystal including the coating thereon. In certain embodiments, the thickness is in the range from greater than about 0 to about 20 monolayers. In certain embodiments, the thickness is in the range from greater than about 0 to about 10 monolayers. In certain embodiments, the thickness is in the range from greater than about 0 to about 5 monolayers. In certain embodiments, the thickness is in the range from about 1 to about 5 monolayers. In certain embodiments, the thickness is in the range from about 3 to about 5 monolayers. In certain embodiments, more than 20 monolayers can be grown.

In certain embodiments, a method taught herein can be repeated to apply more than one coating over a semiconductor nanocrystal. In certain of such embodiments, each coating can have a composition that can be the same as or different from that of another coating.

In certain embodiments, a coating can comprise a semiconductor material that can have a band gap greater than the band gap of the underlying semiconductor nanocrystal. In certain embodiments, a coating can comprise a semiconductor material that can have a band gap less than the band gap of the underlying semiconductor nanocrystal.

A coating comprising a semiconductor material grown in accordance with a method taught herein is prepared by reacting one or more cation precursors and one or more anion precursors for forming the semiconductor material.

As used herein, "cation" refers to a metal element (e.g., a Group I (e.g., Cu, Ag, Au), Group II (e.g., Mg, Zn, Cd, Hg), Group III (e.g., B, Al, Ga, In, Tl), and/or Group IV (e.g., Si, Ge, Sn, Pb) element) included in a semiconductor material; wherein the valence of the element can include zero. As used herein, "anion" refers to a non-metal element (e.g., a Group V (e.g., N, P, As, Sb, Bi) and/or Group VI (e.g., O, S, Se, Te) element) included in a semiconductor material); wherein the valence of the element can include zero.

In certain embodiments, a semiconductor material can comprise binary materials, ternary materials, quaternary materials, and even more complex species that can be prepared using the methods described herein, in which case more than one cation precursor and/or more than one anion precursor may be included.

In certain embodiments, the one or more cation precursors are introduced into the reaction mixture as a solution further including a solvent. Selection of such solvent can be readily determined by the skilled artisan.

In certain embodiments, the one or more anion precursors are introduced into the reaction mixture as a solution further including a solvent. Selection of such solvent can be readily determined by the skilled artisan.

A cation precursor is introduced into the reaction mixture, for example, for each Group I, II, III, and/or IV element included in the composition of a semiconductor material included in the coating. Similarly, an anion precursor is introduced into the reaction mixture, for example, for each Group V and/or VI element included in the composition of a semiconductor material included in the coating. The amounts of precursors are determined based on the composition of the desired semiconductor material being grown, the size of the semiconductor nanocrystal on which the coating is being grown, and the desired thickness of the coating. Such amounts can be readily determined by one of ordinary skill in the art.

Examples of cation precursors can constitute a wide range of substances, such as, but not limited to, a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, a metal coordination complex, a metal solvate, a metal salt, and the like. Non-limiting examples of cation precursors comprising metal alkyl compounds including the desired metal ("M"), e.g., can be represented by the formula $MR_3$ (wherein R=ethyl, propyl, butyl, pentyl, hexyl, isopropyl, isobutyl, tert-butyl, etc.). Other suitable cation precursors can be readily ascertained by one of ordinary skill in the art.

Examples of anion precursors include, but are not limited to, the element itself (oxidation state 0), covalent compounds, or ionic compounds of the group desired Group V and/or VI elements (N, P, As, Sb, S, Se, Te, etc.). For example, an anion precursor can be a chalcogenide (Group VI) precursor and/or a pnictide (Group V) precursor, such as a phosphine chalcogenide, a bis(silyl) chalcogenide, dioxygen, an ammonium salt, or a tris(silyl) pnictide. Examples of various anion precursors include, but are not limited to, dioxygen, bis(trimethylsilyl) selenide ($(TMS)_2Se$), octadecene-Se, trialkyl phosphine selenides such as (tri-n-octylphosphine) selenide (TOPSe) or (tri-n-butylphosphine) selenide (TBPSe), octadecene-Te, trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), octadecene-S, bis(trimethylsilyl) sulfide ($(TMS)_2S$), a trialkyl phosphine sulfide such as (tri-n-octylphosphine)sulfide (TOPS), an ammonium salt such as an ammonium halide (e.g., $NH_4Cl$), tris(trimethylsilyl)phosphide ($(TMS)_3P$), tris(trimethylsilyl) arsenide ($(TMS)_3As$), or tris(trimethylsilyl) antimonide ($(TMS)_3Sb$).

In certain embodiments, the cation precursor and the anion precursor can be moieties within the same molecule.

As discussed above, in certain embodiments, precursors can be added as a mixture and/or separately (depending on the number of other precursors). The amounts of precursor for the other chemical elements of the semiconductor material can be also added simultaneously or sequentially.

The method is preferably carried out at a temperature and for a period of time sufficient to form a coating comprising the desired semiconductor material at a desired thickness.

In certain embodiments, each of the precursors is added at a predetermined rate. The rate of addition for each precursor can be the same or different.

A liquid in which a coating is grown is referred to herein as a solvent. A preferred solvent is one in which the precursors and any other additives (other than the semiconductor nanocrystals and coated semiconductor nanocrystals) are soluble. A solvent can further help control the growth of the coating in certain embodiments In preparing a coating, a coordinating solvent can be preferred. A coordinating solvent is a compound having at least one donor site (e.g., a lone electron pair) that, for example, is available to coordinate to a surface of the growing nanocrystal. Solvent coordination can stabilize the growing nanocrystal and/or coating. In certain embodiments, the liquid medium can comprise a coordinating and/or a non-coordinating solvent.

Selection of solvents can be readily determined by the skilled artisan.

In growing a coating, ligands that coordinate or otherwise attach to an outer surface of the coated semiconductor nanocrystal, for example, can be derived from the solvent and/or other species added to and/or generated in the reaction mixture prior to isolation of the coated particles formed. For example, the amide in the reaction mixture can function as a ligand that coordinates or attaches to a coated semiconductor nanocrystal prepared by a method taught herein.

Optionally, one or more separate ligand compounds can be further included in the reaction mixture. Other ligands that may be included can be determined by the skilled artisan.

Optionally, after the coating is formed, the coated semiconductor nanocrystals can be annealed by continued heating prior to isolation from the growth mixture. In certain embodiments, such annealing can be carried out a temperature that is lower than the growth temperature. Such temperatures can be readily selected by the skilled artisan.

In certain instances, a ligand that coordinates or attaches to a semiconductor nanocrystal or coated semiconductor nanocrystal in the growth process can be modified by repeated exposure to an excess of a competing coordinating group to form an overlayer. For example, a dispersion of the nanocrystals that include ligands can be treated with a coordinating organic compound, such as pyridine, to produce nanocrystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, but not limited to, phosphines, thiols, and amines. The nanocrystal can be exposed to short chain polymers which exhibit an affinity for the surface and which terminate in a moiety having an affinity for a liquid medium in which the nanocrystal is suspended or dispersed. Such affinity improves the stability of the suspension and discourages flocculation of the nanocrystal.

In certain embodiments, a coating is formed over at least a portion, and preferably all, of the outer surface of the semiconductor nanocrystal.

In certain embodiments, semiconductor nanocrystals to be coated are isolated from the reaction mixture in which they are grown prior to being coated by a method taught herein. In certain of such embodiments, such isolated nanocrystals may be further purified before being coated.

In certain embodiments, the coating can be formed over at least a portion of the semiconductor nanocrystal to be coated without prior isolation and/or purification thereof. In certain embodiments of the latter case, the formation of the coating can be carried out in the same reaction vessel in which the semiconductor nanocrystal is formed.

In certain preferred embodiments, the method comprises a colloidal growth process. Colloidal growth occurs by introducing a cation precursor and an anion precursor into a hot solvent. This permits discrete nucleation and results in the controlled growth of macroscopic quantities of the resulting semiconductor material on a semiconductor nanocrystal. The reaction mixture can be gently heated to grow the coating and anneal the coated semiconductor nanocrystal. Both the average size and the size distribution of the coated semiconductor nanocrystal in a sample are dependent on the growth temperature. The growth temperature necessary to maintain steady growth increases with increasing average size. The coated semiconductor nanocrystal is a member of a population of nanocrystals. As a result of the controlled growth, the population of coated semiconductor nanocrystal that can be obtained has a narrow, monodisperse distribution of particle sizes. The monodisperse distribution of particles can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in particle size and more preferably less than 10% rms and most preferably less than 5%.

A narrow size distribution of semiconductor nanocrystals and/or coated semiconductor nanocrystals comprising semiconductor material allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September 1995; and in U.S. patent application Ser. No. 08/969,302 for "Highly Luminescent Color-Selective Materials". The foregoing documents are hereby incorporated herein by reference in their entireties.

The process of controlled coating growth in a solvent that follows nucleation can also result in uniform surface derivatization and regular structures. As the size distribution sharpens, the temperature can be raised to maintain steady growth. By adding more cation precursor or anion precursor, the growth period can be shortened. In certain embodiments, a nanocrystal further includes one or more ligands attached to the surface of the nanocrystal.

Semiconductor nanocrystals on which a coating is grown in accordance with the methods taught herein can include, for example, inorganic semiconductor crystallites between about 1 nm and about 1000 nm in diameter, preferably between about 2 nm and about 50 um, more preferably about 1 nm to about 20 nm (such as about 1, 2, 3, 4, 5, 6, 7, 8, 9, 10, 11, 12, 13, 14, 15, 16, 17, 18, 19, or 20 nm).

Semiconductor nanocrystals on which a coating is grown in accordance with the methods taught herein can preferably comprise chemically synthesized colloidal semiconductor nanocrystals or quantum dots.

In certain embodiments, the semiconductor nanocrystals can have an average particle size in a range from about 1 to about 100 nm.

In certain embodiments, a semiconductor nanocrystal having an average particle size of less than 150 Å can be preferred. In certain embodiments, a population of nanocrystals has an average particle size in a range of about 15 Å to about 125 Å.

A semiconductor nanocrystal can be a member of a population of nanocrystals having a narrow size distribution.

Examples of the shape of the semiconductor nanocrystals include sphere, rod, disk, other shape or mixtures thereof.

In certain embodiments, a semiconductor nanocrystal on which a coating is grown in accordance with a method taught herein can include a core comprising a core semiconductor material and may further include one or more shells that are applied prior to growth of a coating by one of the methods taught herein. In such cases, a shell can typically comprise a semiconductor material. In such cases that include more than one shell, each shell can comprise a semiconductor material that is the same as or different from that included in at least one of the other shells. A semiconductor nanocrystal core surrounded by a semiconductor shell is also referred to as a "core/shell" semiconductor nanocrystal.

Semiconductor nanocrystals (including semiconductor nanocrystal cores) can comprise one or more semiconductor materials. Examples of semiconductor materials include, but are not limited to, Group II-VI compounds (e.g., binary, ternary, and quaternary compositions), Group II-V compounds (e.g., binary, ternary, and quaternary compositions), Group III-VI compounds (e.g., binary, ternary, and quaternary compositions), Group III-V compounds (e.g., binary, ternary, and quaternary compositions), Group IV-VI compounds (e.g., binary, ternary, and quaternary compositions), Group compounds (e.g., binary, ternary, and quaternary compositions), Group II-IV-VI compounds (e.g., binary, ternary, and quaternary compositions), Group II-IV-V compounds (e.g., binary, ternary, and quaternary compositions), Group IV elements, and alloys including any of the foregoing, and/or a mixture including any of the foregoing. Semiconductor nanocrystals can also comprise one or more semiconductor materials that comprise ternary and quaternary alloys that include one or more of the foregoing compounds.

A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture or alloy including any of the foregoing, including ternary and quaternary mixtures or alloys.

As discussed above, a semiconductor nanocrystal on which a coating is grown in accordance with one of the methods taught herein can comprise one or more shells over a surface of the core. A shell typically comprises a semiconductor material, which can have a composition different from the composition of the core. A shell can comprise a Group II-VI compound, Group II-V compound, Group III-VI compound, Group III-V compound, Group IV-VI compound, Group compound, Group II-IV-VI compound, and Group II-IV-V compound. Non-limiting examples of such semiconductor materials include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, a mixture including any one or more of the foregoing, an alloy including any one or more of the foregoing, etc. In certain embodiments, a shell can comprise a Group IV element.

In preparing semiconductor nanocrystals and/or in growing a shell or coating on a surface of a semiconductor nanocrystal, the particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

Transmission electron microscopy (TEM) can provide information about the size, shape, and distribution of the nanocrystal population. Powder X-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum.

Narrow FWHM (full width at half-maximum) of nanocrystals can result in saturated color emission. This can lead to efficient nanocrystal-light emitting devices even in the red and blue parts of the spectrum, since in nanocrystal emitting devices no photons are lost to infrared and UV emission.

The present invention will be further clarified by the following examples, which are intended to be exemplary of the present invention.

EXAMPLES

Example 1

Overcoating of InP Nanocrystals with $ZnSe_xS_{1-x}$ (Wherein 0<x<1) Using Primary Amide as Ligands I. Equivalent Amount of Cores, Reagents and Solvents

| Compound | CAS number | Formula Weight (g/mol) | Moles (mmol) | Amount used |
|---|---|---|---|---|
| Indium phosphide Core | | | $0.16^a$ | |
| Diethylzinc | 557-20-0 | 123.51 | $0.92^b$ | 113 mg/96 µl |
| Bis-(trimethylsilyl) sulfide | 3385-94-2 | 178.44 | $0.46^b$ | 81 mg/97 µl |
| 2M trioctylphosphine selenide | | n/a | $0.46^b$ | 190 mg |
| 13-cis-docosenamide * | 112-84-5 | 337.58 | 6.0 | 2.0 g |
| Squalane | 111-01-3 | 422.81 | | 14 ml |

[a.] The mole amount of InP is a calculated value, based on the absorption peak wavelength and the optical density at 350 nm of 100-fold dilution of the InP solution. Other non-limiting examples of total mole amount of InP include amounts in a range from about 0.12 to about 0.15 mmol.

[b.] The mole amount and ratios can be varied depending on the amount of InP, the number of coating layers, and the percentage of sulfur vs. selenium. The numbers above mentioned are based on 7.5 shell layers made up of $ZnSe_{0.5}S_{0.5}$ for InP cores with absorption peak at 558 nm. (The cores can be prepared by known techniques. Examples of preparation techniques include, for example, but not limited to, those disclosed in U.S. Patent Publication No. 20100052512, of Christopher R. Clough, et al., published 4 Mar. 2010 for "Nanocrystals Including a Group IIIA Element and a Group VA Element, Method, Composition, Device and Other Products.)

13-cis-docosenamide can be exchanged instead of several different kinds of primary amide with the same molar amounts.

II. General Preparation

All cores, reagents and solvents are kept in a glove box after appropriate air-free treatment. Standard glove box and Schlenk techniques are used unless mentioned. Diethylzinc is filtered through a 0.2 μm syringe filter prior to use and kept in freezer. Squalane is degassed under vacuum at high temperature prior to use. 2 M tri-n-octylphosphine selenide (TOP-Se) is prepared by dissolving selenium shot in trioctylphosphine.

III. Synthesis Procedures 8 ml of squalane is transferred into the pot which has 2 g of 13-cis-docosenamide and evacuated for 30 min. (The setup includes 4-neck, 50 ml round bottom flask equipped with a stir bar inside, whose two necks are connected to a thermocouple temperature probe and a condenser with $N_2$/vacuum inlet/outlet and the rest two necks are stopped by septa. All connections are standard 14/20 ground glass joints lubricated with silicone grease—except septa. The flask is heated with a heating mantle connected to a digital temperature controller.) The mixture of squalane and amide is degassed at 40° C. for one hour and is then placed under $N_2$ atmosphere.

The amount of cleaned InP cores in hexane is mixed with 2 ml of squalane under air free condition. The residual hexane is removed under vacuum at 75° C. in a proper glassware set, and then the InP cores dispersed in squalane are ready for use.

Zn, Se and S precursor solutions are prepared in a glove box. The predetermined amount of 2 M TOP-Se and bis-(trimethylsilyl)sulfide is measured out in one vial and loaded into a 5 ml syringe, diluting with squalane up to the total volume of 2.0 ml forming the selenide/sulfide precursor solution. The corresponding amount of diethylzinc is measured in a vial and loaded into another 5 ml syringe with squalane forming total 2.0 ml of zinc precursor solution. When the pot and the InP cores in squalane are ready for use, two precursor syringes are taken out from a glove box and connected to capillaries and then loaded to a syringe pump. The two ends of capillaries are plunged to the pots until they touch the surface of the solution so that the precursor solution can get into solution without making a drop. The temperature is set to 200° C., and once it reaches to 170° C. precursor solutions are injected at the rate of 2 ml/hr. A few minutes later when the temperature is at 200° C., inject 2 ml of the InP cores in squalane with continuous injection of precursors. After the addition of all precursors, the temperature is set to 150° C. and stayed overnight under $N_2$ atmosphere. The reaction is then syringed into an evacuated, septum-capped vial for transport into a glove box.

IV. Measurements

Small amount of crude solution is mixed with hexane in air free condition. The absorption, emission and quantum yield are measure with the sample filtered and diluted to a proper optical density range.

V. Results

The results of InP/ZnSe$_{0.5}$S$_{0.5}$ based on several primary amides as a ligand are summarized in Table 1, and the chemical structures of the primary amide ligands used for the synthesis of InP/ZnSe$_{0.5}$S$_{0.5}$ in the above-described Batches are shown in FIG. 1.

The results shows that below mentioned primary amides perform comparable shell growth as a single major ligand on InP cores to growing a coating with a similar composition on InP cores wherein a combination of both ester (e.g., methyl myristate) and primary amine (e.g., oleylamine) are included in the growth mixture instead of a primary amide.

TABLE 1

Summary of spectral properties of InP/ZnSe$_{0.5}$S$_{0.5}$ synthesized using primary amide as a ligand.

| Batch # | Ligands | Core batch # Abs/Emi/FWHM (nm) | Abs peak (nm) | Emission peak (nm) | FWHM (nm) | QY (%) |
|---|---|---|---|---|---|---|
| 1A | Oleylamine (control experiment) | InPC-012 558/597/58 | 574 | 610 | 64 | 46 |
| 1B | 2,2-di-n-propylacetamide | InPC-012 558/597/58 | 576 | 608 | 64 | 42 |
| 1C | Lauramide | InPC-012 558/597/58 | 575 | 606 | 62 | 39 |
| 1D | cis-13-Docosenamide | InPC-012 558/597/58 | 571 | 605 | 59 | 46 |
| 1E | Benzamide | InPC-012 558/597/58 | 575 | 607 | 58 | 48 |
| 1F | p-Toluamide | InPC-028 561/607/56 | 579 | 612 | 62 | 61 |

VI. Scale Up Results

The use of primary amide simplifies the shell growth reaction on InP cores by not generating side reactions such as the in situ secondary amide formation. Additionally, primary amides can be more compatible with a wider range of materials that can be included in downstream formulations which can avoid material incompatibilities that can hinder optical performance of semiconductor nanocrystals.

A 20 times scale up of the reactions listed in Table 1 was performed maintaining spectral quality of nanocrystals, and the results are summarized in Table 2.

TABLE 2

Summary of spectral properties of InP/ZnSe$_{0.5}$S$_{0.5}$ synthesized using primary amide as a ligand in larger reaction scale.

| Batch # | Ligands, Scale | Core batch # Abs/Emi/FWHM (nm) | Abs peak (nm) | Emission peak (nm) | FWHM (nm) | QY (%) |
|---|---|---|---|---|---|---|
| 1G | cis-13-Docosenamide, 20 X | InPC-042 575/608/54 | 586 | 611 | 51 | 54 |
| 1H | cis-13-Docosenamide, 20 X | InPC-052 582/608/55 | 593 | 618 | 48 | 50 |

Example 2

Overcoating of InP Nanocrystals with ZnSe$_x$S$_{1-x}$ (Wherein $0<x<1$)

I. Equivalent Amount of Cores, Reagents and Solvents

| Compound | CAS number | Formula Weight (g/mol) | Moles (mmol) | Amount used |
|---|---|---|---|---|
| Indium phosphide Core | | | 0.096 [a] | |
| Diethylzinc | 557-20-0 | 123.51 | 1.1 [b] | 131 mg/111 μl |
| Bis-(trimethylsilyl) sulfide | 3385-94-2 | 178.44 | 0.53 [b] | 95 mg/112 μl |
| 1M tri-n-octylphosphine selenide | | n/a | 0.53 [b] | 0.53 ml |
| Oleylamine | 112-90-3 | 267.49 | 6.08 | 2.0 ml |
| Squalane | 111-01-3 | 422.81 | | 9.0 ml |
| Methylmyristate | 124-10-7 | 242.41 | | 5.0 ml |

[a] The mole amount of InP is calculated based on the absorption peak wavelength and the optical density at 350 nm of 100-fold dilution of the InP solution. Other non-limiting examples of total mole amount of InP include amounts in a range from about 0.070 mmol to about 1.2 mmol.
[b] The mole amount and ratios vary depending on the amount of InP, a number of shell layers, and a percentage of sulfur vs. selenium. The numbers above mentioned are based on 7.5 shell layers made up of ZnSe$_{0.5}$S$_{0.5}$ for InP cores with absorption peak at 513 nm.

II. General Preparation

All cores, reagents and solvents are kept in a glove box after appropriate air-free treatment. Standard glove box and Schlenk techniques are used unless mentioned. Diethylzinc is filtered through a 0.2 μm syringe filter prior to use and kept in freezer. Methylmyristate and oleylamine are distilled under vacuum, and squalane is degassed under vacuum at high temperature prior to use. 1M tri-n-octylphosphine selenide (TOP-Se) is prepared by dissolving selenium shot in trioctylphosphine.

III. Synthesis Procedures 5 ml of squalane and 5 ml of methyl myristate are transferred into the pot which has been preheated at 100° C. and evacuated for 30 min. (The setup includes 4-neck, 50 ml round bottom flask equipped with a stir bar inside, whose two necks are connected to a thermocouple temperature probe and a condenser with N$_2$/vacuum inlet/outlet and the rest two necks are stopped by septa. All connections are standard 14/20 ground glass joints lubricated with silicone grease—except septa. The flask is heated with a heating mantle connected to a digital temperature controller.) The solvent is degassed at 75° C. for one hour and is then placed under N$_2$ atmosphere.

The InP solution in n-hexane is prepared in a glove box and syringed into the pot containing the degassed solvent. n-Hexane is removed by vacuum at 75° C. for one hour and then the pot is placed back under N$_2$ atmosphere. Meanwhile removing residual hexane, Zn, Se and S precursor solutions are prepared in a glove box. The calculated amount of 1M TOP-Se and bis-(trimethylsilyl)sulfide is measured out in one vial and loaded into a 5 ml syringe, diluting with squalane up to the total volume of 2.0 ml forming the selenide/sulfide precursor solution. The corresponding amount of diethylzinc is measured in a vial and loaded into another 5 ml syringe with squalane forming total 2.0 ml of zinc precursor solution. When the pot is under N$_2$ atmosphere at 75° C. without residual n-hexane, two precursor syringes are taken out from a glove box and connected to capillaries and then loaded to a syringe pump. The two ends of capillaries are plunged to the pots until they touch the surface of the solution so that the precursor solution can get into solution without making a drop. The temperature is set to 200° C., and once it reaches to 170° C. precursor solutions are injected at the rate of 2 ml/hr. A few minutes later when the temperature is at 200° C., inject 2 ml of oleylamine with continuous injection of precursors. After the addition of all precursors, the temperature is set to 150° C. and stayed overnight under N$_2$ atmosphere. The reaction is then syringed into an evacuated, septum-capped vial for transport into a glove box.

IV. Crashing-Out (Or Precipitation) Procedures

Upon cooling, a flocculent, reddish solid precipitates out of the red reaction mixture. The reaction mixture is reheated to 70° C. to redissolve the solid, forming a red, homogenous solution. The mixture is diluted with 20 ml n-hexane and cooled down long enough the solid to precipitate. After being centrifuged (4000 rpm for 8 min), the red supernatant is decanted and collected and the reddish solids are washed with 10 ml of n-hexane and centrifuged again. The supernatant is decanted off and added to the first fraction. 20 ml of n-butanol is added to the red nanocrystal solution followed by enough methanol to make the solution turbid (typically ~20 ml). The turbid solution is then centrifuged and the supernatant is decanted and discarded. The reddish solid left behind is dissolved in 5 ml n-hexane and filtered through a 0.2 μm PTFE syringe filter. Optical properties are obtained in dilute n-hexane solution. Photophysical spectra give the first absorption peak of 542±2 nm and emission peak of 575±5 nm with a FWHM=55±5 nm and a quantum yield of 50-60%.

V. Alternatives of Oleylamine and Squalane 3-(2-ethylhexyloxy)propylamine and 3,3-diphenylpropylamine can be used for the substitute of oleylamine. Both ligands accomplished a quantum yield about 50% as comparable as oleylamine ligand system. 3-(2-ethylhexyloxy) propylamine was degassed with N$_2$ and stored with dried molecular sieves in a glove box. 3,3-diphenylpropylamine was degassed with N$_2$ at 35° C. These liquid ligands were injected as the same way as the procedures for oleylamine.

Dodecanophenone, p-tolyl sulfoxide, 3-phenylbicyclohexyl, and o-terphenyl can be used as substitutes for squalane. These materials were initially explored in the reaction via complete replacement of squalane in the reaction mixture (i.e. =5 g for the solids; Dodecanophenone, p-tolyl sulfoxide, and o-terphenyl. ~5 ml for the liquids; 3-phenylbicyclohexyl).

|  |  | Crude | | | | After Crash-out | | | |
|---|---|---|---|---|---|---|---|---|---|
| Rxn # | Ligands | Abs (nm) | Emi (nm) | FWHM (nm) | QY (%) | Abs (nm) | Emi (nm) | FWHM (nm) | QY (%) |
| 2A | 3-(2-ethylhexyloxy)propylamine | 575 | 609 | 63 | 47 | 578 | 611 | 61 | 50 |
| 2B | 3,3-diphenylpropylamine | 572 | 606 | 64 | 42 | 573 | 609 | 61 | 49 |
| 2C | 2,2-di-n-propylacetamide | 576 | 608 | 62 | 40 | 580 | 613 | 59 | 29 |

The following aromatic solvents were direct substitutes for Squalane. (Absorbance peak/Emission peak/FWHM/Quantum efficiency Results are provided under the structure for each used solvent.):

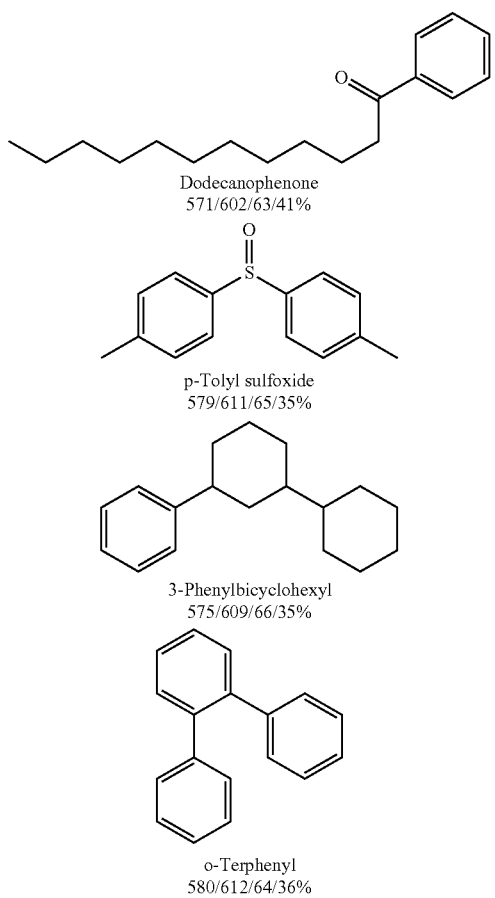

Dodecanophenone
571/602/63/41% p-Tolyl sulfoxide
579/611/65/35%

3-Phenylbicyclohexyl
575/609/66/35% o-Terphenyl
580/612/64/36%

Semiconductor nanocrystals on which a coating is grown in accordance with the present inventions can be included in emissive materials for use in light-emitting devices, displays, and other optoelectronic and electronic devices, including, but not limited to, those described, for example, in International Application No. PCT/US2007/013152, entitled "Light-Emitting Devices And Displays With Improved Performance", of QD Vision, Inc. et al., filed 4 Jun. 2007, which is hereby incorporated herein by reference in its entirety.

Semiconductor nanocrystals on which a coating is grown in accordance with the present inventions can be included in photoluminescent applications including, but not limited to, those described in U.S. Application No. 60/971,885, of Coe-Sullivan, et al., entitled "Optical Component, System Including An Optical Component, Devices, And Composition", filed 12 Sep. 2007, and U.S. Application No. 60/973,644, entitled "Optical Component, System Including An Optical Component, Devices, And Composition", of Coe-Sullivan, et al., filed 19 Sep. 2007, each of which is hereby incorporated herein by reference in its entirety.

Additional information that may be useful with the present inventions is included in International Application No. PCT/US2008/007901 of Linton, et al., for "Compositions And Methods Including Depositing Nanomaterial", filed 25 Jun. 2008; U.S. Patent Publication No. 20100052512, of Christopher R. Clough, et al., published 4 Mar. 2010 for "Nanocrystals Including a Group IIIA Element and a Group VA Element, Method, Composition, Device and Other Products, U.S. Ser. No. 12/283,609 of Coe-Sullivan, et al. for "Compositions, Optical Component, System Including An Optical Component, Devices, And Other Products", filed 12 Sep. 2008, International Application No. PCT/US2010/059931, filed 10 Dec. 2010 by QD Vision, Inc., et al., for "Semiconductor Nanocrystals and Methods of Preparation" (which published as International Publication No. WO 2011/100023 on 18 Aug. 2011), International Application No. PCT/US2012/038198, filed 16 May 2012 by QD Vision, Inc., et al., for "Method For Preparing Semiconductor Nanocrystals", U.S. Patent Application Publication No. US 2005/0129947 A1, of X. Peng, et al., for "Monodisperse Core/Shell And Other Complex Structured Nanocrystals And Methods Of Preparing The Same", B. O. Dabbousi, et al., "(CdSe)ZnS Core-Shell Quantum Dots: Synthesis And Characterization Of A Size Series Of Highly Luminescent Nanocrystallites", *J. Phys. Chem. B* 1997, 101, 9463-9475, C. A. Leatherdale, et al., "On the Absorption Cross Section of CdSe Nanocrystal Quantum Dots", *J. Phys. Chem. B*, 2002, 106 (31), pp 7619-7622, and M. A. Hines, et al., "Synthesis And Characterization Of Strongly Luminescing ZnS-Capped CdSe Nanocrystals", *J. Phys. Chem.*, 1996, 100, 468-471. The disclosures of each of the foregoing applications are hereby incorporated herein by reference in their entireties.

As used herein, the singular forms "a", "an" and "the" include plural unless the context clearly dictates otherwise. Thus, for example, reference to an emissive material includes reference to one or more of such materials.

The entire contents of all patent publications and other publications cited in this disclosure are hereby incorporated herein by reference in their entirety.

Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. Additional embodiments of the present invention will also be apparent to those skilled in the art from consideration of the specification and practice of the invention disclosed herein. It is intended that the specification and examples be considered as exemplary only, with a true scope and spirit of the invention being indicated by the following claims and equivalents thereof.

The invention claimed is:

1. A method for forming a coating comprising a semiconductor material on at least a portion of a population of semiconductor nanocrystals, the method comprising:
   providing a first mixture including semiconductor nanocrystals comprising a semiconductor material including a Group III-V compound and a solvent,
   introducing a primary amide compound, one or more cation precursors and one or more anion precursors into the first mixture to form a reaction mixture for forming the semiconductor material, and
   reacting the precursors in the reaction mixture, without the addition of an acid compound, in the presence of the primary amide compound, to grow the coating comprising the semiconductor material on at least a portion of an outer surface of at least a portion of the semiconductor nanocrystals.

2. A method in accordance with claim 1 wherein the primary amide compound is introduced after initiating introduction of the one or more cation precursors and one or more anion precursors.

3. A method in accordance with claim 1 wherein the solvent comprises a mixture of two or more solvents.

4. A method in accordance with claim 1 wherein an amine compound is further included in the reaction mixture during growth of the coating.

5. A method in accordance with claim 1 wherein an amine compound is further included in the reaction mixture before initiating introduction of the one or more cation precursors and one or more anion precursors.

6. A method for forming a coating comprising a semiconductor material on at least a portion of a population of semiconductor nanocrystals, the method comprising:
   providing a first mixture including semiconductor nanocrystals and an aromatic solvent,
   introducing an amine compound and a primary amide compound, one or more cation precursors and one or more anion precursors into the first mixture to form a reaction mixture for forming the semiconductor material, and
   reacting the precursors in the reaction mixture, without the addition of an acid compound, in the presence of the amine compound and the primary amide compound, to grow the coating comprising the semiconductor material on at least a portion of an outer surface of at least a portion of the semiconductor nanocrystals.

* * * * *